US010839918B1

(12) United States Patent
Chibvongodze et al.

(10) Patent No.: US 10,839,918 B1
(45) Date of Patent: Nov. 17, 2020

(54) BOOST CONVERTER IN MEMORY CHIP

(71) Applicant: SanDisk Technologies LLC, Addison, TX (US)

(72) Inventors: Hardwell Chibvongodze, San Jose, CA (US); Masatoshi Nishikawa, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/449,604

(22) Filed: Jun. 24, 2019

(51) Int. Cl.
*G11C 16/30* (2006.01)
*H01L 25/00* (2006.01)
*H01L 25/18* (2006.01)
*H01L 23/64* (2006.01)

(52) U.S. Cl.
CPC ............ *G11C 16/30* (2013.01); *H01L 23/645* (2013.01); *H01L 25/18* (2013.01); *H01L 25/50* (2013.01)

(58) Field of Classification Search
CPC ................................ G11C 16/26; G11C 16/30
USPC ............................................. 365/189.05, 226
See application file for complete search history.

(56) References Cited

U.S. PATENT DOCUMENTS

| | | | | |
|---|---|---|---|---|
| 5,677,874 A * | 10/1997 | Yamano | ................. | G11C 16/30 365/185.18 |
| 6,538,494 B2 * | 3/2003 | Zimlich | ................. | G11C 5/145 327/536 |
| 6,734,655 B1 * | 5/2004 | Javanifard | ............. | G11C 5/145 323/222 |
| 8,122,307 B1 * | 2/2012 | Lindhorst | ............ | G11C 17/146 714/719 |
| 8,629,548 B1 * | 1/2014 | Andreev | ................... | G06F 1/10 257/691 |
| 8,930,647 B1 * | 1/2015 | Smith | ................... | G06F 3/0661 711/154 |
| 2004/0027907 A1 * | 2/2004 | Ooishi | .................... | G11C 11/15 365/226 |
| 2008/0080255 A1 * | 4/2008 | Kagan | .................... | G11C 16/30 365/185.23 |
| 2008/0117691 A1 * | 5/2008 | Kawasaki | .............. | G11C 16/16 365/185.33 |
| 2009/0147433 A1 * | 6/2009 | Gabara | .................. | H01L 24/95 361/233 |
| 2011/0188321 A1 * | 8/2011 | Kito | ...................... | H01L 29/792 365/185.29 |

(Continued)

*Primary Examiner* — Michael T Tran
(74) *Attorney, Agent, or Firm* — Dickinson Wright PLLC; Steven Hurles (57) ABSTRACT

Boost converter in memory chip. A non-volatile memory including an in-chip boost converter includes: a first memory structure defines control circuitry disposed on a first substrate, and a first metal layers disposed adjacent the control circuitry, where the first metal layer couples elements of the control circuitry; and a second memory structure defines a memory array disposed on a second substrate, and a second metal layer disposed adjacent the memory array, where the first and second metal layers are bonded together by a permanent physical bond formed between the first and second metal layers; and a boost converter defining an inductor disposed in the first and second metal layers, and a transistor circuit disposed in the control circuitry. The non-volatile memory, where the inductor further defines a first terminal coupled to a voltage source, and a second terminal coupled to a load by way of a transistor circuit.

20 Claims, 9 Drawing Sheets

(56) References Cited

U.S. PATENT DOCUMENTS

| | | | | |
|---|---|---|---|---|
| 2011/0199838 A1* | 8/2011 | Terada | ............... | G11C 16/12 |
| | | | | 365/189.07 |
| 2011/0260781 A1* | 10/2011 | Takeuchi | ............ | G11C 16/30 |
| | | | | 327/537 |
| 2012/0166582 A1* | 6/2012 | Binder | ............... | H04L 67/327 |
| | | | | 709/217 |
| 2013/0051126 A1* | 2/2013 | Kwong | ............... | H01G 4/005 |
| | | | | 365/149 |
| 2013/0314391 A1* | 11/2013 | Jin | ............... | G09G 3/3406 |
| | | | | 345/212 |
| 2014/0104952 A1* | 4/2014 | Takeuchi | ............ | G11C 16/26 |
| | | | | 365/185.17 |
| 2016/0035394 A1* | 2/2016 | Zhang | ............... | G11C 7/00 |
| | | | | 257/777 |
| 2018/0068735 A1* | 3/2018 | Hirose | ............... | G11C 16/08 |
| 2018/0071515 A1* | 3/2018 | Weiss | ............... | A61N 1/05 |
| 2018/0071516 A1* | 3/2018 | Weiss | ............... | A61N 1/025 |
| 2018/0102704 A1* | 4/2018 | Achter | ............... | H02M 3/07 |
| 2019/0020272 A1* | 1/2019 | Disney | ............... | H01L 33/007 |
| 2019/0042376 A1* | 2/2019 | Babazadeh | ......... | G06F 11/1675 |
| 2020/0030904 A1* | 1/2020 | Erdmann | ............ | B23K 9/1056 |
| 2020/0065278 A1* | 2/2020 | Lukas | ............... | G06F 1/3215 |
| 2020/0186033 A1* | 6/2020 | Lee | ............... | H02M 7/06 |

\* cited by examiner

BOOST CONVERTER IN MEMORY CHIP

BACKGROUND

Non-volatile memory systems retain stored information without requiring an external power source. One type of non-volatile memory that is used ubiquitously throughout various computing devices and in stand-alone memory devices is flash memory. For example, flash memory can be found in a laptop, a digital audio player, a digital camera, a smart phone, a video game, a scientific instrument, an industrial robot, medical electronics, a solid state drive, and a USB drive.

During operation of flash memory, high-voltages—such as 30 volts—are used for operations such as erase and program. Often such high voltages are not directly available from a power supply—such as an external power supply—which have voltage ranges between 1-5 volts. Instead the high voltages are generated by circuits embedded within the flash memory that are configured to produce the high voltages from the power supply. Example circuits include embedded voltage converting circuits and charge pump circuits.

SUMMARY

Various embodiments include non-volatile memory including an in-chip boost converter including: a first memory structure defining control circuitry disposed on a first substrate, and a first metal layer disposed adjacent the control circuitry, where the first metal layer couples elements of the control circuitry; and a second memory structure defining a memory array disposed on a second substrate, and a second metal layer disposed adjacent the memory array, where the first and second metal layers are bonded together by a permanent physical bond formed between the first and second metal layers; and a boost converter defining an inductor disposed in the first and second metal layers, and a transistor circuit disposed in the control circuitry.

Other embodiments include a method for manufacturing a three dimensional memory structure including an in-chip boost converter including: fabricating, using a first process, a first memory structure on a first substrate, by: forming control circuitry on a first substrate; depositing a first metal layer on the control circuitry, where the first metal layer is coupled to the control circuitry; and fabricating a first portion of an inductor in the first metal layer. The method further includes fabricating, using a second process, a second memory structure on a second substrate, by: forming a memory array defining stacked memory cells, on the second substrate; depositing a second metal layer on the memory array; and fabricating a second portion of the inductor in the second metal layer. The method additionally includes bonding the first memory structure with the second memory structure by forming a permanent bond between the first and second metal layers such that the first and second portions of the inductor are aligned.

Additional embodiments include a memory controller, including: a first terminal configured to couple to a three dimensional memory including an in-chip boost converter defining an inductor disposed in metal layers between a memory array and control circuitry, the memory controller configured to: pre-charge a circuit in the control circuitry by way of the in-chip boost converter; and perform a memory operation.

BRIEF DESCRIPTION OF THE DRAWINGS

For a detailed description of example embodiments, reference will now be made to the accompanying drawings in which.

DETAILED DESCRIPTION

The following discussion is directed to various embodiments of the invention.

Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to imply that the scope of the disclosure, including the claims, is limited to that embodiment.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections. References to a controller shall mean individual circuit components, an application-specific integrated circuit (ASIC), a microcontroller with controlling software, a digital signal processor (DSP), a processor with controlling software, a field programmable gate array (FPGA), or combinations thereof.

At least some of the example embodiments are directed to a non-volatile memory including a first memory structure formed on a first wafer, a second memory structure formed on a second wafer, wherein the non-volatile memory is formed by bonding the two wafers. Components of a charge pump—specifically a boost converter—including an inductor are disposed in the metal layers of the non-volatile memory. Thus the charge pump as described herein is disposed within a memory chip and is referred to herein as an in-chip charge pump of in-chip boost converter.

Over the past years, power supplies in complimentary metal-oxide-semiconductor (CMOS) have scaled faster than the write/erase (W/E) voltage circuits used to perform write/erase operations in flash memory. For example, voltages used for the purposes of performing write/erase operations can range between 10-30 volts. In contrast, the power supply voltages (Vcc) have been reduced to as low as 1 volt. In various embodiments, charge pumps are used to bridge the difference in voltages. Specifically, charge pumps are used to generate higher voltages (e.g., 10-30 volts from a 1 volt power supply) internal to the memory chip.

Overall, the power conversion efficiency, the chip size, the voltage regulation, as well as the loading characteristics are factors that are important to a design of the memory chip. In particular, power supplies have scaled to meet a desire to create memory that consumes less energy. A lower supply voltage (Vcc) results in lower energy consumption (e.g., saving current consumption) from memory core operations because less charge is used to pre-charge respective nodes.

However, an overall current savings from lowering voltages is not fully realized because despite the lower voltages, charge pumps can consume more current to generate the higher voltages used to perform write/erase operations. Specifically, the power consumption of a flash memory—e.g., a memory chip—is impacted by the power conversion efficiency of the charge pump. The more efficiently a charge pump operates—for example the more efficiently a charge pump is able to produce the higher voltage, the less power consumed by the flash memory during operation.

Some embodiments of charge pumps can have low efficiency—e.g. charge pumps including several pump stages implemented using capacitors and transistors, can have an efficiency of around 20-30%. In this example, a charge pump may only be able to generate 3 milliamperes (mA) for every 10 mA provided to the charge pump.

Other embodiments of charge pumps have a higher efficiency, including charge pumps using boost converters. Although boost converters demonstrate higher efficiency—by using less current than other charge pumps to generate the same amount of voltage—boost converters come with tradeoffs. Boost converters utilize spiral inductors that can take up significant space on a memory chip. Additionally, the performance of a boost converter, both output voltage ($V_{OUT}$) and rise time is associated and affected by characteristics of the inductor including: resistivity and size.

For example, as the scaling of CMOS technology has continued to move toward smaller memory cells or more densely packed memory chips, it has become increasing difficult to accommodate a spiral inductor on a memory chip. The embodiments and techniques described herein are related to a charge pump that demonstrates high power conversion efficiency, while fitting on a memory chip.

As described herein, example embodiments of a non-volatile memory are fabricated by forming a first memory structure on a first wafer, a second memory structure on a second wafer and bonding the two wafers. Components of a charge pump—such as a boost converter including an inductor—are disposed in the metal layers of the memory chip.

Figure 1:
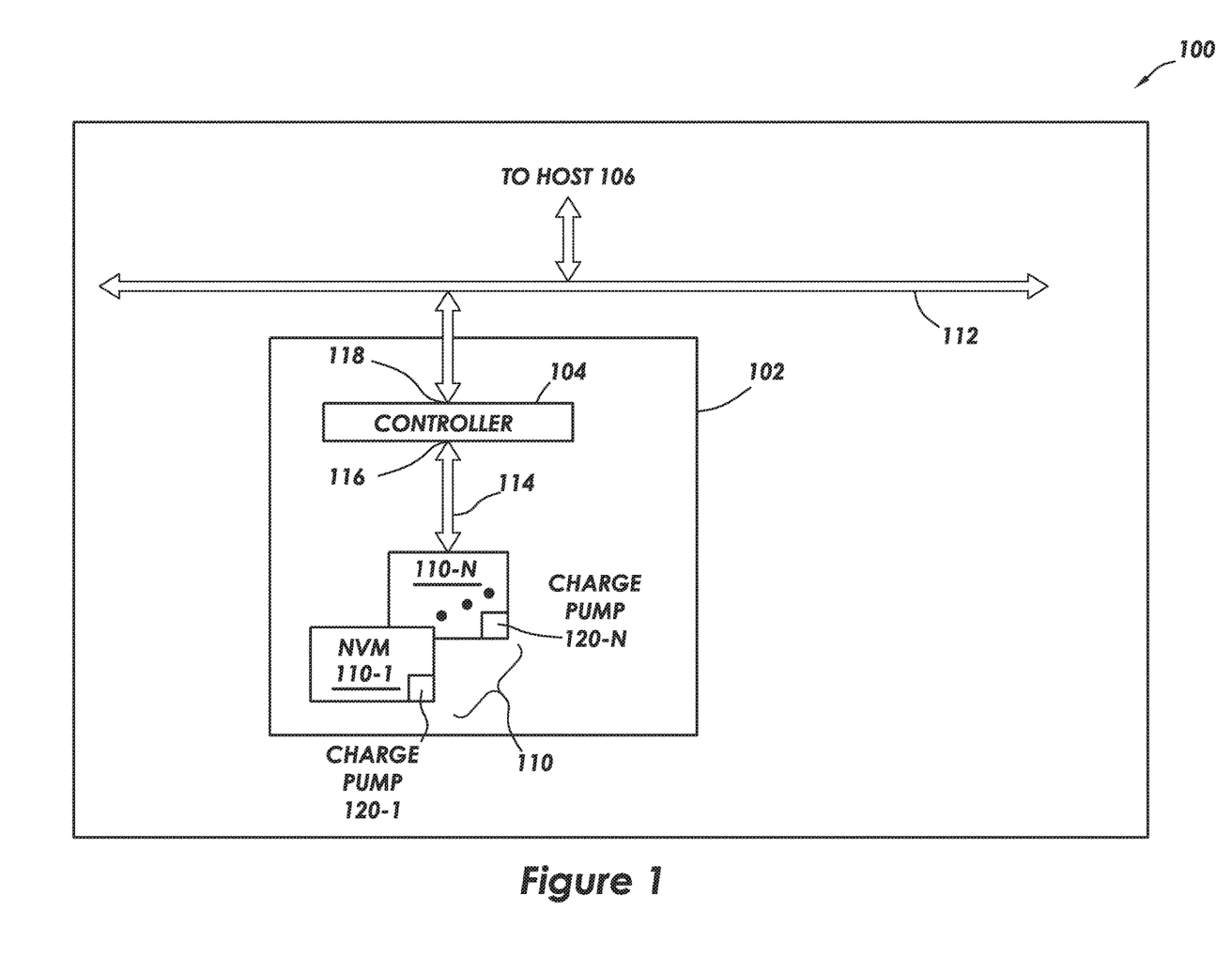
FIG. 1 illustrates a block diagram of an example non-volatile memory system, in accordance with some embodiments.

FIG. 1 illustrates a block diagram of an example system architecture 100 including non-volatile memory 110. In particular, the example system architecture 100 includes storage system 102 that further includes a controller 104 communicatively coupled to a host 106 by a bus 112. The bus 112 implements any known or after developed communication protocol that enables the storage system 102 and the host 106 to communicate. Some non-limiting examples of a communication protocol include Secure Digital (SD) protocol, Memory Stick (MS) protocol, Universal Serial Bus (USB) protocol, or Advanced Microcontroller Bus Architecture (AMBA).

The controller 104 has at least a first port 116 coupled to a non-volatile memory ("NVM") 110, hereinafter "memory 110" by way of a communication interface 114. The memory 110 is disposed within the storage system 102. The controller 114 couples the host 106 by way of a second port 118 and the bus 112. The first and second ports 116 and 118 of the controller can include one or several channels that couple the memory 110 or the host 106, respectively.

The memory 110 of the storage system 102 includes several memory die 110-1-110-N. The manner in which the memory 110 is defined in FIG. 1 is not meant to be limiting. In some embodiments, the memory 110 defines a physical set of memory die, such as the memory die 110-1-110-N. In other embodiments, the memory 110 defines a logical set of memory die, where the memory 110 includes memory die from several physically different sets of memory die. The memory die 110 include non-volatile memory cells that retain data even when there is a disruption in the power supply. Thus, the storage system 102 can be easily transported and the storage system 102 can be used in memory cards and other memory devices that are not always connected to a power supply.

As described in more detail herein, the memory die 110 can represent a memory chip that includes a charge pump circuit 120. Of note, the charge pump circuit 120 is one that is present on the memory chip and not external to the memory chip-such as on an interposer or on a board containing the memory chip. For example, embodiments of the charge pump circuit 120 include an inductor that is disposed on the memory chip.

In various embodiments, the memory cells in the memory die 110 are solid-state memory cells (e.g., flash), one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash).

Still referring to FIG. 1, the controller 104 and the memory 110 are communicatively coupled by an interface 114 implemented by several channels (e.g., physical connections) disposed between the controller 104 and the individual memory die 110-1-110-N. The depiction of a single interface 114 is not meant to be limiting as one or more interfaces can be used to communicatively couple the same components. The number of channels over which the interface 114 is established varies based on the capabilities of the controller 104. Additionally, a single channel can be configured to communicatively couple more than one memory die. Thus the first port 116 can couple one or several channels implementing the interface 114. The interface 114 implements any known or after developed communication protocol. In embodiments where the storage system 102 is flash memory, the interface 114 is a flash interface, such as Toggle Mode 200, 400, or 800, or Common Flash Memory Interface (CFI).

In various embodiments, the host 106 includes any device or system that utilizes the storage system 102—e.g., a computing device, a memory card, a flash drive. In some example embodiments, the storage system 102 is embedded within the host 106—e.g., a solid state disk (SSD) drive installed in a laptop computer. In additional embodiments, the system architecture 100 is embedded within the host 106 such that the host 106 and the storage system 102 including the controller 104 are formed on a single integrated circuit chip. In embodiments where the system architecture 100 is implemented within a memory card, the host 106 can include a built-in receptacle or adapters for one or more types of memory cards or flash drives (e.g., a universal serial bus (USB) port, or a memory card slot).

Although, the storage system 102 includes its own memory controller and drivers (e.g., controller 104), the example described in FIG. 1 is not meant to be limiting. Other embodiments of the storage system 102 include memory-only units that are instead controlled by software executed by a controller on the host 106 (e.g., a processor of a computing device controls—including error handling of—the storage unit 102). Additionally, any method described herein as being performed by the controller 104 can also be performed by the controller of the host 106.

Still referring to FIG. 1, the host 106 includes its own controller (e.g., a processor) configured to execute instructions stored in the storage system 102 and further the host 106 accesses data stored in the storage system 102, referred to herein as "host data". The host data includes data originating from and pertaining to applications executing on the host 106. In one example, the host 106 accesses host data stored in the storage system 102 by providing a logical address to the controller 104 which the controller 104 converts to a physical address. The controller 104 accesses the data or particular storage location associated with the physical address and facilitates transferring data between the storage system 102 and the host 106. In embodiments where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104). Thus, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Figure 2:
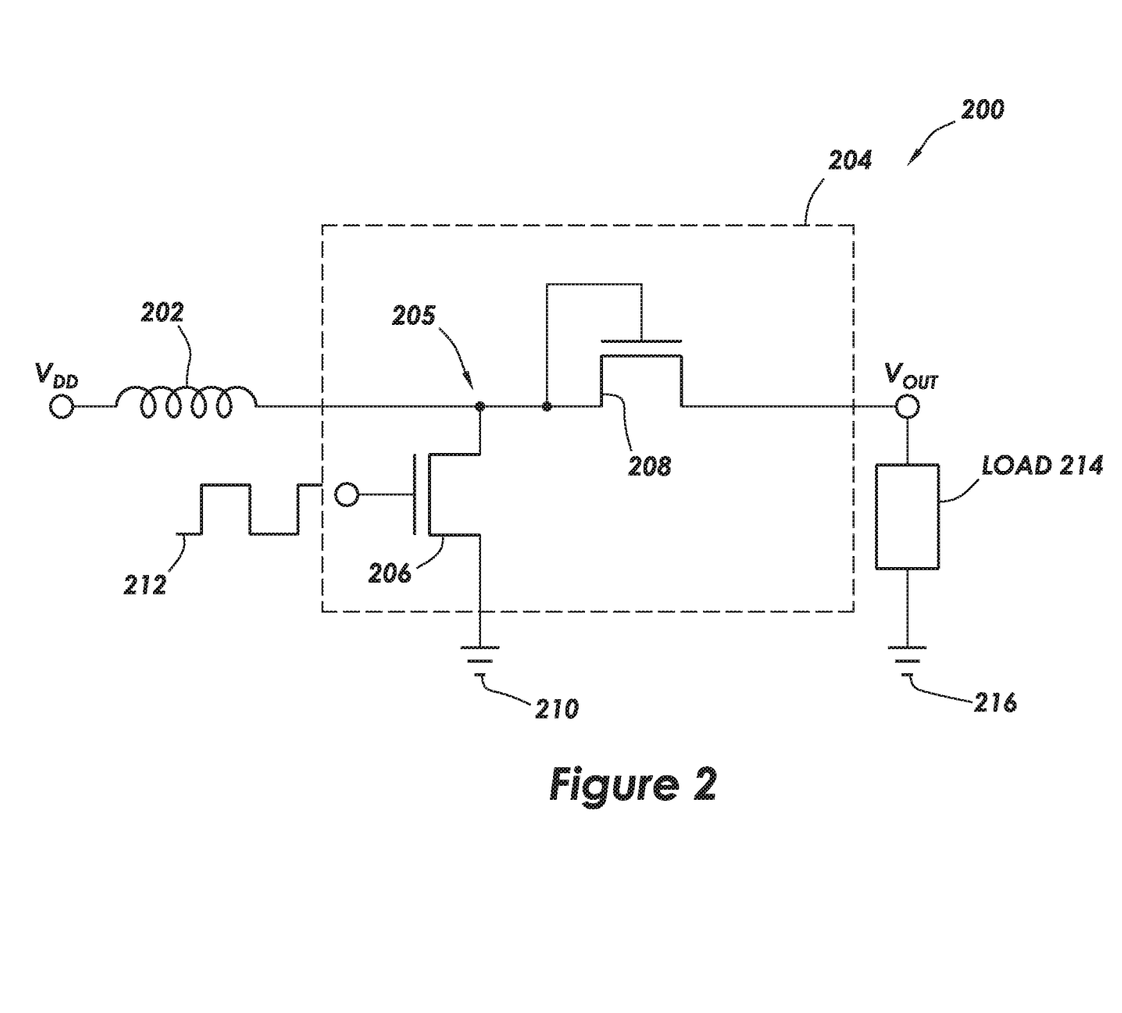
FIG. 2 illustrates a circuit diagram of charge pump, in accordance with some embodiments.

FIG. 2 illustrates an example charge pump 200 that is disposed on a memory chip (e.g., memory 110-1). Specifically, the charge pump 200 is a boost converter defining an inductor 202, and a switching circuit 204. The inductor 202 defines a first terminal coupled to a voltage source (e.g., $V_{DD}$) and a second terminal coupled to the switching circuit 204 by way of a boost node 205.

The example switching circuit 204 defines a switch 206 and a second switch 208. Specifically, in one embodiment, the switch 206 is a first MOS transistor 206 and the switch 208 is a second MOS transistor 208. The first MOS transistor 206 defines a first terminal coupled to the boost node 205, a second terminal coupled to a ground 210, and a gate coupled to a clock signal 212. The second MOS transistor 208 defines a first terminal coupled to the boost node 205, a second terminal coupled to a load 214 (e.g., by way of $V_{OUT}$), and a gate coupled to the first terminal of the second MOS transistor 208.

The load 214 defines a first terminal coupled to VOUT and a second terminal coupled to a ground 216. In some embodiments the ground 214 is tied to the ground 214, while in other embodiments, the ground 214 has a potential different from a potential of the ground 216.

During operation of the charge pump 200, a resulting $V_{OUT}$ is higher than the voltage provided by the voltage source ($V_{DD}$). In one example, during operation, the clock signal 212 defines a waveform that drives the switch 206. Example waveforms include a square wave, a sinusoidal wave, a triangle wave, and the like. In one example, the clock signal 212 defines a square wave that drives the switch 206.

Figure 3A:
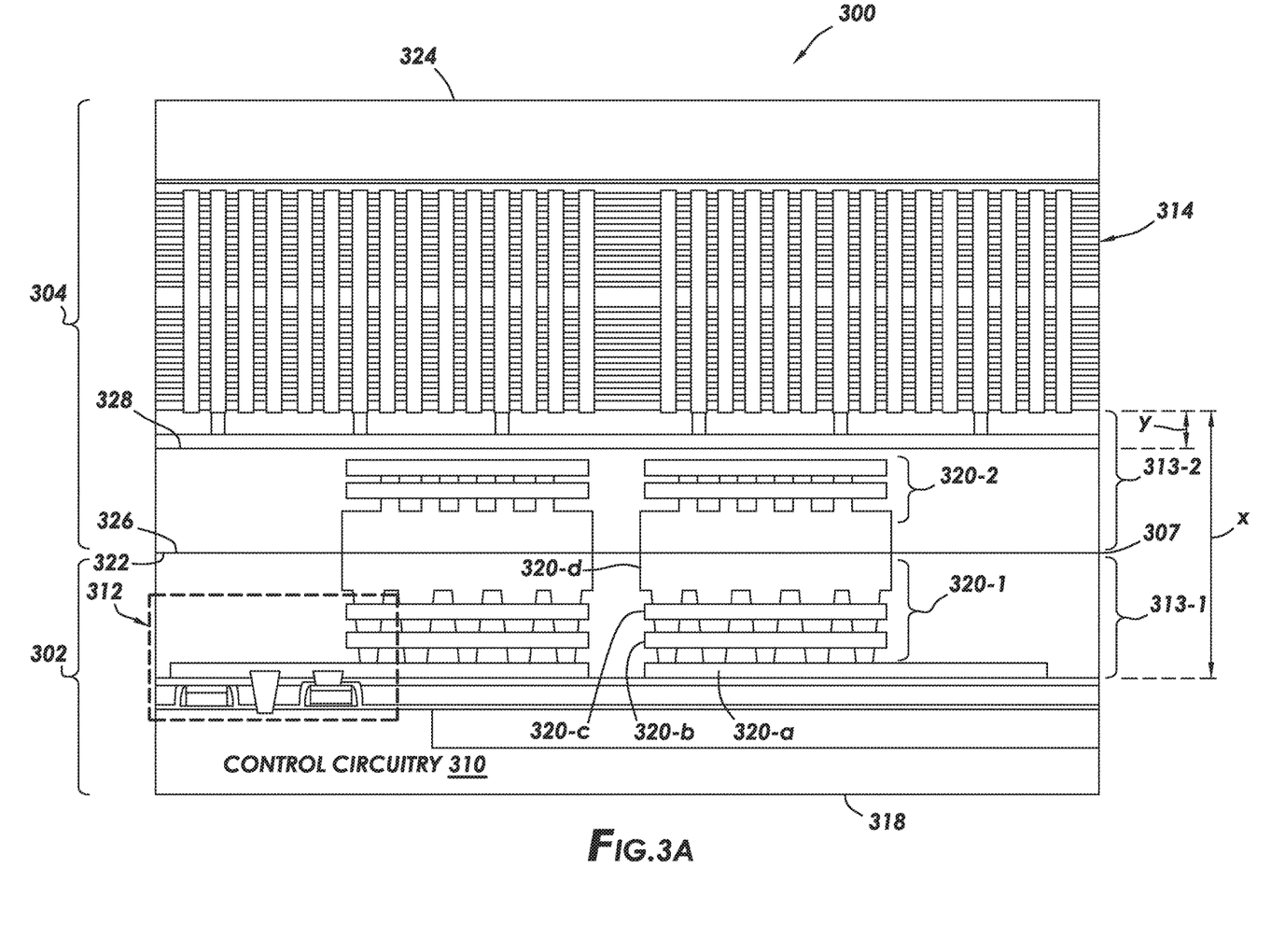
FIG. 3A illustrates a block diagram of a cross-section of an example memory chip that includes a boost converter, in accordance with some embodiments.

FIG. 3A illustrates a block diagram of a cross-section of an example memory chip 300 that includes a boost converter, according to some embodiments. The memory chip 300 defines a memory array 314, and the charge pump including an inductor 320 and the switching circuit 312. For reference, the dotted box identifying the switching circuit 312 coincides with the dotted box identifying the switching circuit 204 (described in FIG. 2).

In particular, the memory chip 300 includes a first memory structure 302 defining control circuitry 310 and metal layers 313-1, and a second memory structure 304 defining a memory array 314 and additional metal layers 313-2. Specifically, the first memory structure 302 is fabricated on a first substrate such as a wafer, while the second memory structure 304 is fabricated on a second substrate, separate and different from the first substrate. The processing steps performed to fabricate the first memory structure 302 is different from the processing steps performed to fabricate the second memory structure 304.

The first memory structure 302 defines control circuitry 310 that includes a portion of the charge pump (e.g., the switching circuit 312 and first portion of inductor 320-1) as well as metal layers 313-1. The second memory structure 304 defines a memory array 314 as well as metal layers 313-2. After undergoing respective processing steps to fabricate the first and second memory structures 302 and 304, the two structures are bonded together at location 307 by a permanent bond formed between the metal layers 313.

In various embodiments, the permanent bond can be a physical, chemical, or hybrid bond. Further, as used herein a physical bond include hybrid bonds. For example the hybrid bond can be a permanent bond that combines a dielectric bond with embedded metal to form interconnections.

According to some embodiments, the permanent bond can be formed using any known wafer level bonding techniques including but not limited to adhesive bonding (polymer bonding), metal diffusion bonding, eutectic bonding, silicon direct bonding (e.g., fusion bonding), and hybrid bonding. Adhesive bonding is a low temperature and patternable technique, metal diffusion and eutectic bonding can provide direct interconnection, while silicon direct bonding can provide high via density and better alignment.

In some examples, hybrid bonding technology can combine metal-to-metal bonding and wafer bonding with organic adhesives or inorganic dielectrics to achieve intrinsic metal interconnection. In this example of a hybrid bonding technology, the adhesive serves as reinforcement of the mechanical stability between stacked structures.

Still referring to the example block diagram of an example memory chip 300 in FIG. 3A, the first memory structure 302 has a bottom edge 318 defined in part by a bottom surface of the substrate upon which the control circuitry 310 is disposed, and a top edge 322 defined in part by an upper most layer of the metal layer 213-1.

Example control circuitry 310 defined within the first memory structure 302 can include control circuits, read/ write circuits, row decoder circuits, and column decoder circuits. The control circuitry 310 also includes various connections that couple the control circuits to one or more row or column decoder circuits. The example control circuitry 310 is configured to access the memory cells in the memory array 314 defined in the second memory structure 304 using operations that include reading, erasing, and writing to the memory cells.

Example control circuits can additionally include a power control circuit, an address decoder, and a state machine. An example power control circuit controls the power and voltage supplied to the word line and bit lines during operation of the memory chip 300. An example address decoder provides an address interface that translates addresses between addresses provided by the host 106 and addresses used by a row decoder and a column decoder and vice versa. In one example, a state machine provides chip-level control of memory operations. The discussion of example control circuitry 310 is not meant to be limiting and any known architecture that can perform the functions of accessing the memory cells defined in the second memory structure 304 can be used without departing from the scope of this disclosure.

Still referring to FIG. 3A, the second memory structure 304 includes the memory array 314. The second memory structure 304 has a bottom edge 324 defined in part by a bottom surface of the second substrate upon which the memory array 314 is disposed and a top edge 326 defined in part by an upper most layer of the metal layer 313-2. The memory array 314 further defines several memory cells that are coupled to a bit line 318. Accordingly, as shown in FIG. 3A, the bit line 318 is disposed within the metal layer 313-2.

With respect to the metal layers 313-1 and 313-2, the metal layers 313 can include one or more physical and distinct metal layers deposited at various times during the processing steps. During a bonding process, the portion of the metal layers that defines respective top edges 322 and 326 are ultimately bonded together to form a permanent bond as described above. In one example, after the wafers have been bonded, the metal layers 313 have a height x, where the metal layers 313 are sandwiched between the memory array 314 and the control circuitry 310.

In accordance with embodiments described herein, during the process of bonding the two memory structures, the first portion of the inductor 320-1 is aligned with a second portion of the inductor 320-2, and the bonding process forms bonded inductor 320 disposed within the metal layers 313 as shown in the cross-section view in FIG. 3A. In one example, the bonded inductor 320 uses thick copper routing.

In various embodiments, in order to realize a larger inductance per unit area, the bonded inductor 320 is a stacked spiral inductor or a stacked coil inductor. A size of the bonded inductor can be defined by the number of metal layers defining the inductor. For example, two metal layers (e.g., metal layer 320-a and metal layer 320-b) can be placed on top of each other and connected in series by a via (a column). In turn, the metal layers 320-a and 320-b can be coupled to a bonding pad 320-c. Specifically, according to one embodiment, prior to bonding the two memory structures (e.g., by way of a permanent bond), the first portion of the inductor 320-1 is defined by multiple metal layers within the metal layer 313-1, while the second portion of the inductor 320-2 is defined by additional multiple metal layers within the metal layer 313-2. In one example, the first portion of the inductor 320-1 is defined by four metal layers, while the second portion of the inductor 320-2 is defined by three metal layers. Accordingly a size of the first and second portion of the inductor can vary.

Furthermore, a size of the inductor 320 is determined by other components that may be present within the metal layers 313. For example, as shown in FIG. 3A, the inductor 320 is disposed under memory cells of the memory array 314 that are coupled to the bit line 328. Accordingly, the bit line 328 occupies a portion of the metal layers 313-2—where the portion of metal layers that include the bit line 328 has a height y units. Given the total height of the metal layers 313 is x units, the remaining height (e.g., x-y units) defines a height of the metal lines that includes the inductor 320. In one example embodiment, x units—the height of the metal layers 313—can have a height between 5 micrometers ($\mu m$) to 10 $\mu m$. In other embodiments, the height of the metal layers 313 can be between 2 to 14 $\mu m$. In various embodiments, as the height of the metal layers increases, so can the height of the inductor.

Figure 3B:
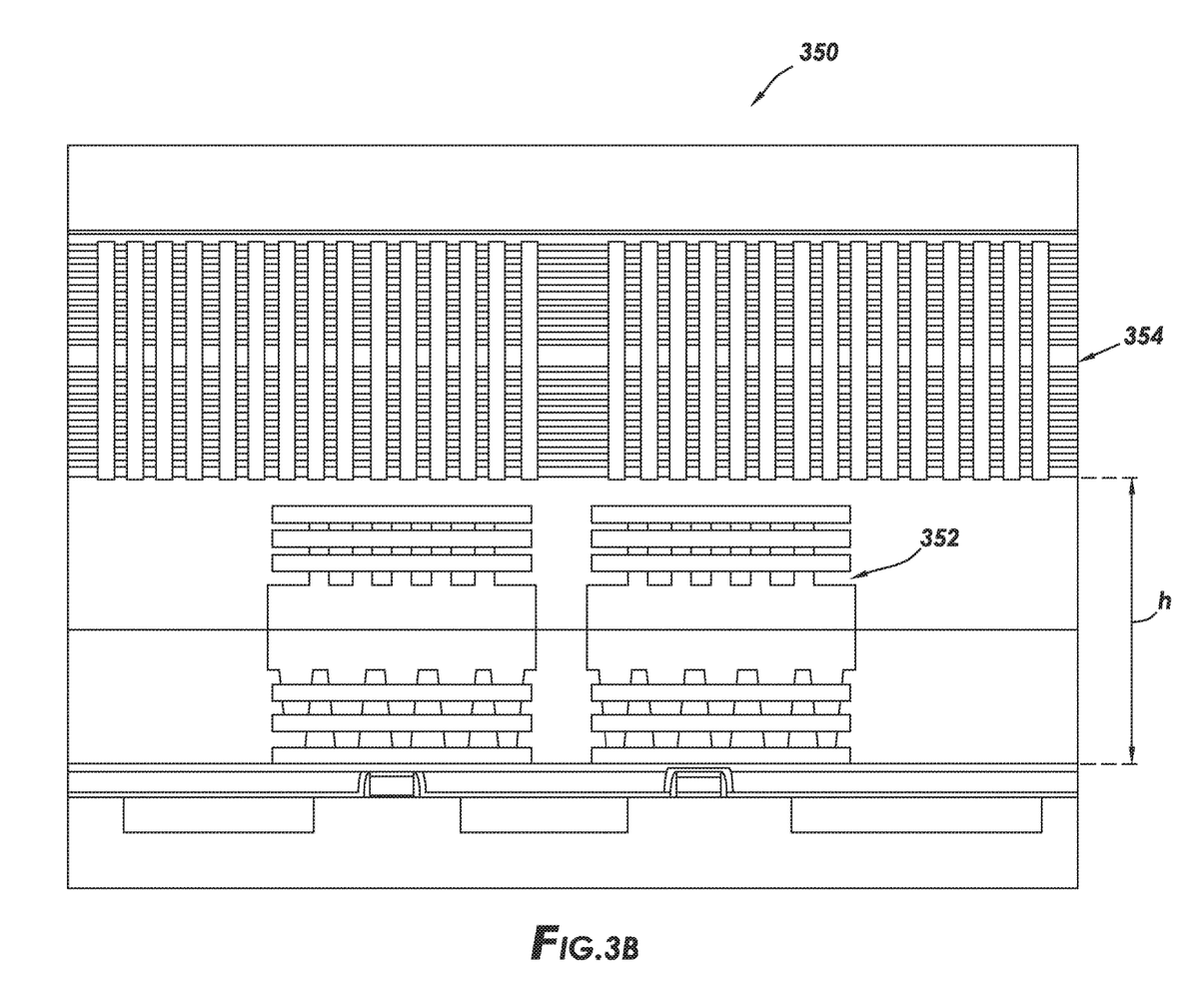
FIG. 3B illustrates a block diagram of a cross-section of an example memory chip that includes a boost converter, in accordance with some embodiments.

FIG. 3B illustrates an additional block diagram of a cross-section of an example memory chip 350 that includes a boost converter. In particular, the inductor 352 disposed in the metal layers is larger than the inductor 320 (described in FIG. 3A). As previously described, a size of the inductor is determined by other components that may be present within the metal layers.

In FIG. 3B, memory array 354 includes dummy memory cells. Accordingly, a bit line is absent in the metal layers beneath the memory array 354. Thus, the inductor 352 is fabricated to occupy additional metal layers that might have otherwise included one or more bit lines. In one example, the inductor 352 has additional metal layers than the example inductor 320 (FIG. 3A). For example, both the first and second portions of the inductor 352 each define four metal layers. Thus, in accordance with the examples described in FIGS. 3A and 3B, a size of the inductor 352 (FIG. 3B) is larger than a size of the inductor 320 (FIG. 3A).

In some embodiments, a threshold amount defines the number of metal layers defining a portion of the inductor that may be present when additional components are present in the metal layers (e.g., a bit line). Thus, in scenarios where an inductor is disposed under one or more dummy memory cells, the number of metal layers defining the inductor is greater than the threshold amount. In scenarios where an inductor is disposed under memory cells coupled to a bit line, the number of metal layers occupied by the inductor is equal to or less than the threshold amount.

As previously described, the performance of a boost converter including output voltage is associated and affected by characteristics of the inductor including: resistivity and size. As described in accordance with FIGS. 3A and 3B, space considerations are addressed by fabricating the inductor in the metal layers that are already present as part of the manufacturing steps of the memory chip. The size of the metal layers is sufficient to accommodate an inductor with inductance that allows the charge pump to operate in accordance with operating specifications—e.g. the charge pump operates with 70% or higher efficiency.

In one example, the metal layers can accommodate various sizes of inductors that have an inductance of around 50 nanoHenry (nH)-330 nH. Next, considerations regarding resistivity are addressed. In particular, the resistivity of the inductor is important, given the inductor is implemented within the memory chip.

Figure 4:
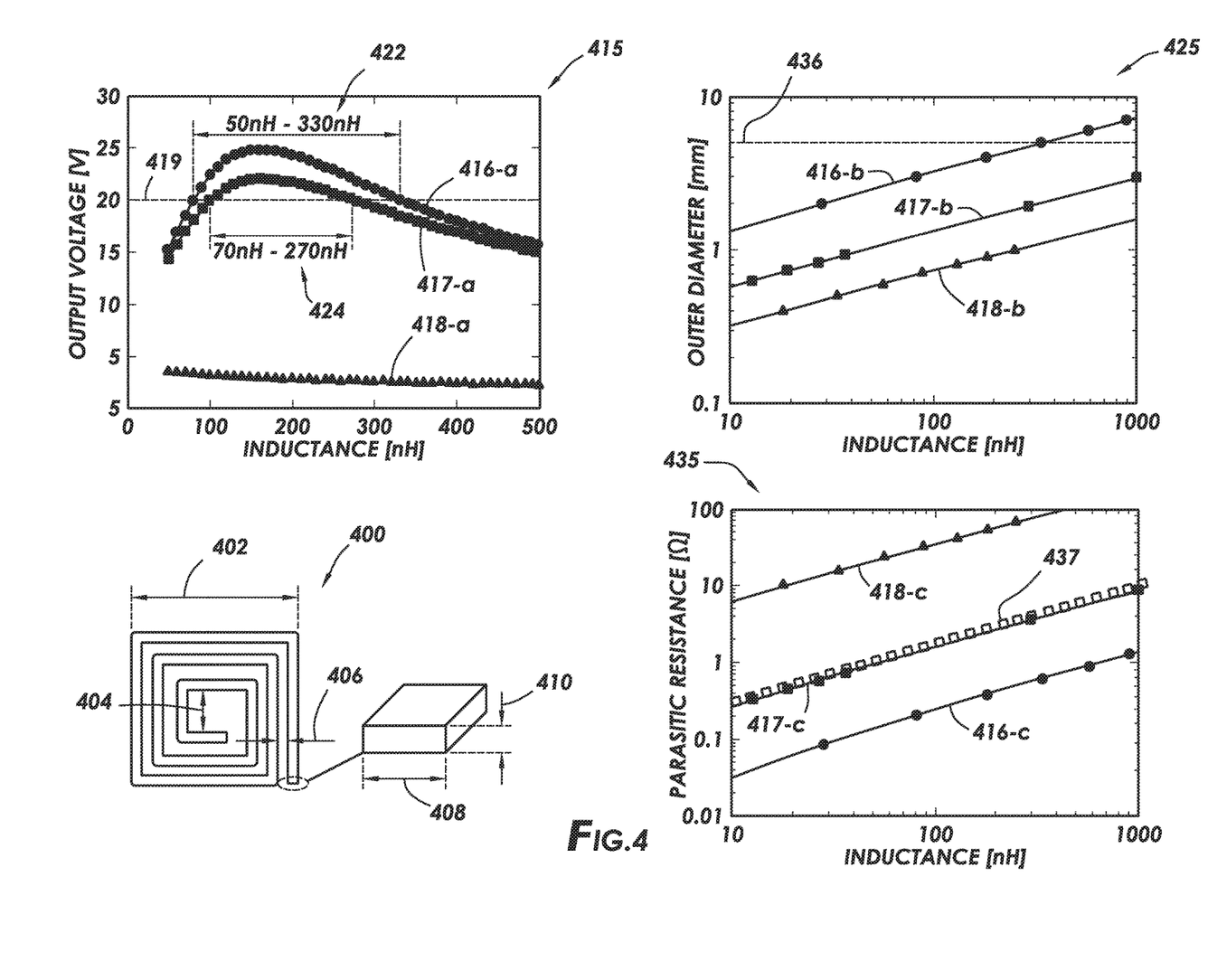
FIG. 4 illustrates plots, in accordance with some embodiments.

FIG. 4 illustrates several plots demonstrating various relationships between an attribute of an inductor and an inductance of the inductor. As is known, the inductance of an inductor is influenced by the core material, core shape and size, the turns count, the shape of the coil, and dimensions of the coil.

For example, and as illustrated by the spiral inductor 400, various attributes can include: an outer diameter 402, an inner diameter 404, spacing between coils 406, a line width 408, and thickness 410. As used herein, a spiral inductor includes embodiments in which a metal line spirals inward (or outward) to form a spiral shape. The metal line has a given line width 408 and thickness 410. The outer diameter 402 as used herein, references a distance from one outer edge to an opposite outer edge of the inductor 400.

The inner diameter 404 references a diameter of an innermost spiral of the spiral inductor. The space between the coils 406 references a spacing between adjacent walls of the metal line (e.g., spacing between adjacent spirals). In one example, a bigger line width 408 is associated with a smaller resistance.

The plot 415 demonstrates a relationship between an inductance of an inductor and an output voltage. The plots 425 and 435 demonstrate specific relationships between inductance and various attributes. The three plots demonstrate respective relationships for conventional charge pumps that have an inductor disposed in various portions of a memory system including: on-board, on an interposer, and on the memory chip.

With respect to the conventional charge pumps, the inductor disposed on aboard has a line width of 100 micrometers, line thickness of 35 micrometers, a spacing between coils of 100 micrometers, and is comprised of copper. Further with respect to the conventional charge pumps, the inductor disposed on an interposer has a line width of 25 micrometers, a line thickness of 15 micrometers, a spacing between coils of 25 micrometers, and is comprised of copper. Additionally, with respect to a conventional charge pump including an inductor disposed on the memory chip, the inductor has a line width of 10 micrometers, a line thickness of 2 micrometers, a spacing between coils of 10 micrometers, and is comprised of aluminum.

Data corresponding to an inductor placed on a board coupling the memory chip is captured by plot lines 416-a, 416-b, and 416-c, an inductor placed on an interposer is captured by plot lines 417-a, 417-b, and 417-c, and an inductor placed on a memory chip is captured by plot lines 418-a, 418-b, and 418-c. Of note, the plot lines 418 are associated with an inductor placed on a memory chip that do not implement the various embodiments disclosed herein. That is, the plot lines 418 are associated with an on-chip inductor that is different from an on-chip inductor as described herein in accordance with various embodiments.

The plot 415 demonstrates measured relationships between inductance and output voltage, where the x-axis captures inductance value (e.g., 0 nanoHenrys (nH) to 500 nH) and the y-axis captures voltage values (e.g., 0 volts (V)-30 V). Dotted line 419 demonstrates an example target voltage (e.g., around 20 volts). Inductance ranges 422 and 424 demonstrate that at least with known methods that place inductors on a board and on an interposer, a target output voltage (dotted line 419) is achievable. However, for known methods that place an inductor on the memory chip, the target output voltage is not attainable for inductances ranging from 0 nH to 500 nH.

The plot 425 demonstrates measured relationships between an outer diameter of a respective inductor and inductance, where the x-axis captures inductance values (e.g., 10 nH-1000 nH) and the y-axis captures an outer diameter (e.g., 0.1 mm-10 mm). Dotted line 436 illustrates an example target area representing an upper bound of an inductor size, where the size is defined by an outer diameter such as outer diameter 402.

The plot 435 demonstrates measured relationships between a parasitic resistance and inductance, where the x-axis captures inductance values (e.g., 10 nH-1000 nH) and the y-axis captures a parasitic resistance (e.g., 0.01 ohms-100 ohms). In various embodiments, the parasitic resistance of an inductor fabricated in accordance with various embodiments herein, is around the same as the parasitic resistance associated with an inductor placed on an interposer (plot line 417-c). The parasitic resistance associated with an inductor fabricated and placed in accordance with embodiments described herein is represented by dashed line 437.

As demonstrated by the plots 415, 425, and 435, the described embodiments herein are capable of producing a target amount of output voltage (e.g., dotted line 419), remain within the upper bounds of an inductor size (dotted line 436), and maintain a parasitic resistance that is similar to that of an inductor placed on an interposer (e.g., close to plot line 417-c). In accordance with various embodiments, an inductor as described herein can be fabricated from aluminum, copper, cobalt, or some combination thereof. In one example, an inductor as described herein defines a line spacing between coils (e.g., spacing 406) between 5 μm and 20 μm, a line width (e.g., width 408) between 10 μm and 20 μm, and a line thickness (e.g., thickness 410) between 2 μm and 5 μm. In another example, an inductor as described herein defines a line spacing between coils (e.g., spacing 406) between 2 μm and 25 μm, a line width (e.g., width 408) between 5 μm and 25 μm, and a line thickness (e.g., thickness 410) between 1 μm and 10 μm.

Accordingly, FIGS. 1-4 describe a non-volatile memory that includes an in-chip charge pump including an inductor disposed between metal layers. The metal layers provide an area large enough to house an inductor that produces an output voltage that meets the specifications of the memory chip's write/erase circuits. Furthermore, embodiments of the inductor described herein demonstrates parasitic resistance similar to that associated with an inductor placed on an interposer (e.g., inductor placed on an interposer using known methods).

Figure 5A:
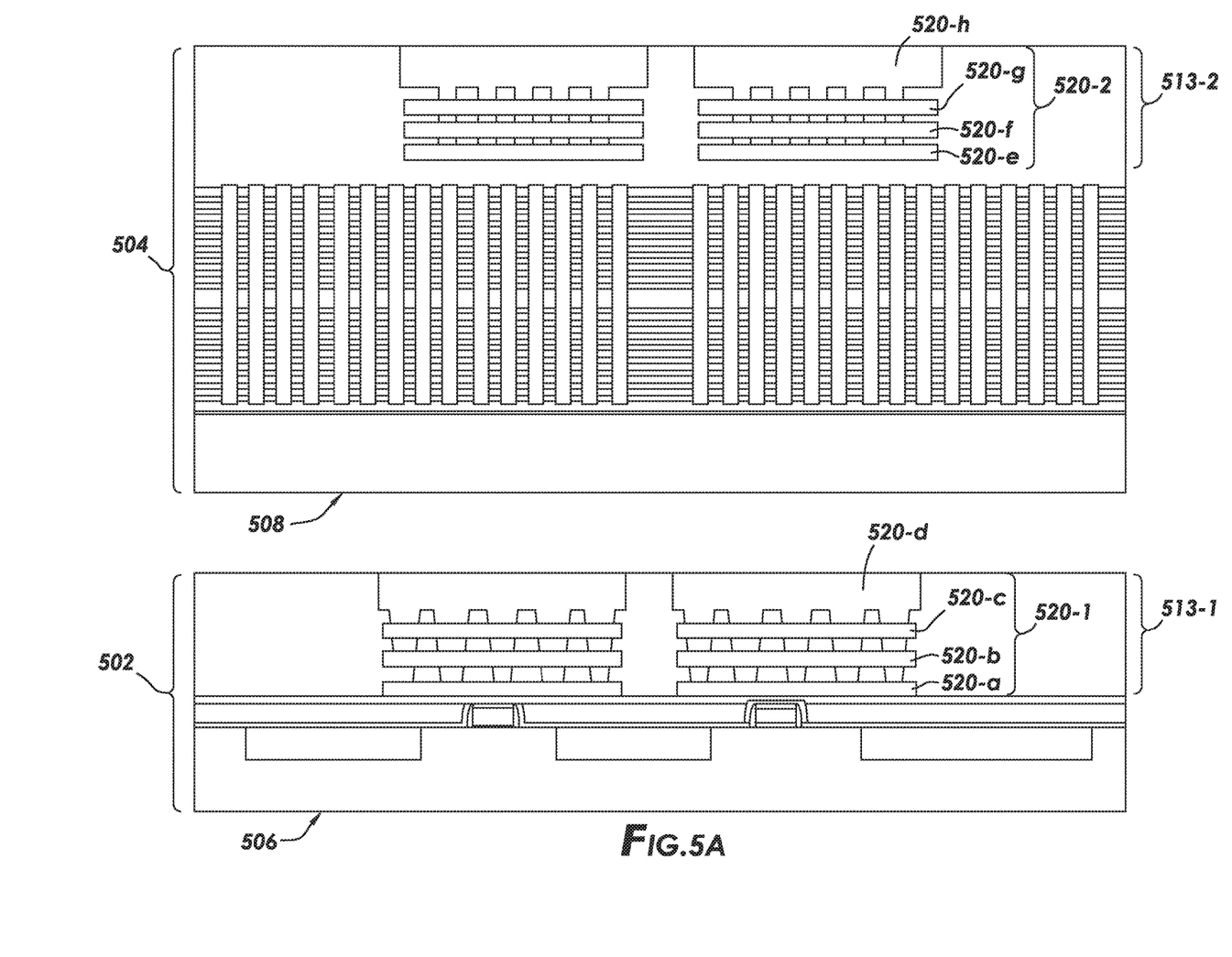
FIG. 5A illustrates a conceptual and method diagram in which a memory chip is fabricated, in accordance with some embodiments.

FIG. 5A illustrates a conceptual and method diagram in which a memory chip is fabricated, in accordance with some embodiments. By way of example, a first memory structure 502 and a second memory structure 504 are fabricated on separate substrates. For example, the first memory structure 502 is fabricated on a wafer 506, while the second memory structure 504 is fabricated on a wafer 508.

As previously described, the first memory structure 502 includes control circuitry and a first portion of an inductor 520-1 that is disposed within the metal layers 513-1. The first portion of the inductor 520-1 defines one or more metal layers (e.g., metal layers 520-a, 520-b, and 520-c) and additionally a bonding area 520-d. The second memory structure 504 includes a memory array, metal layers 513-2, and a second portion of the inductor 520-2 disposed within the metal layers 513-2. Similar to the first portion, the second portion of the inductor 520-2 defines one or more metal layers (e.g., metal layers 520-d, 520-e, and 520-f) and additionally a bonding area 520-g.

In some examples, the bonding areas 520-d and 520-g are flush with an uppermost metal layer. For example, the bonding area 520-d is flush with an uppermost layer of the metal layer 513-1 and the bonding area 520-g is flush with an uppermost layer of the metal layer 513-2.

Figure 5B:
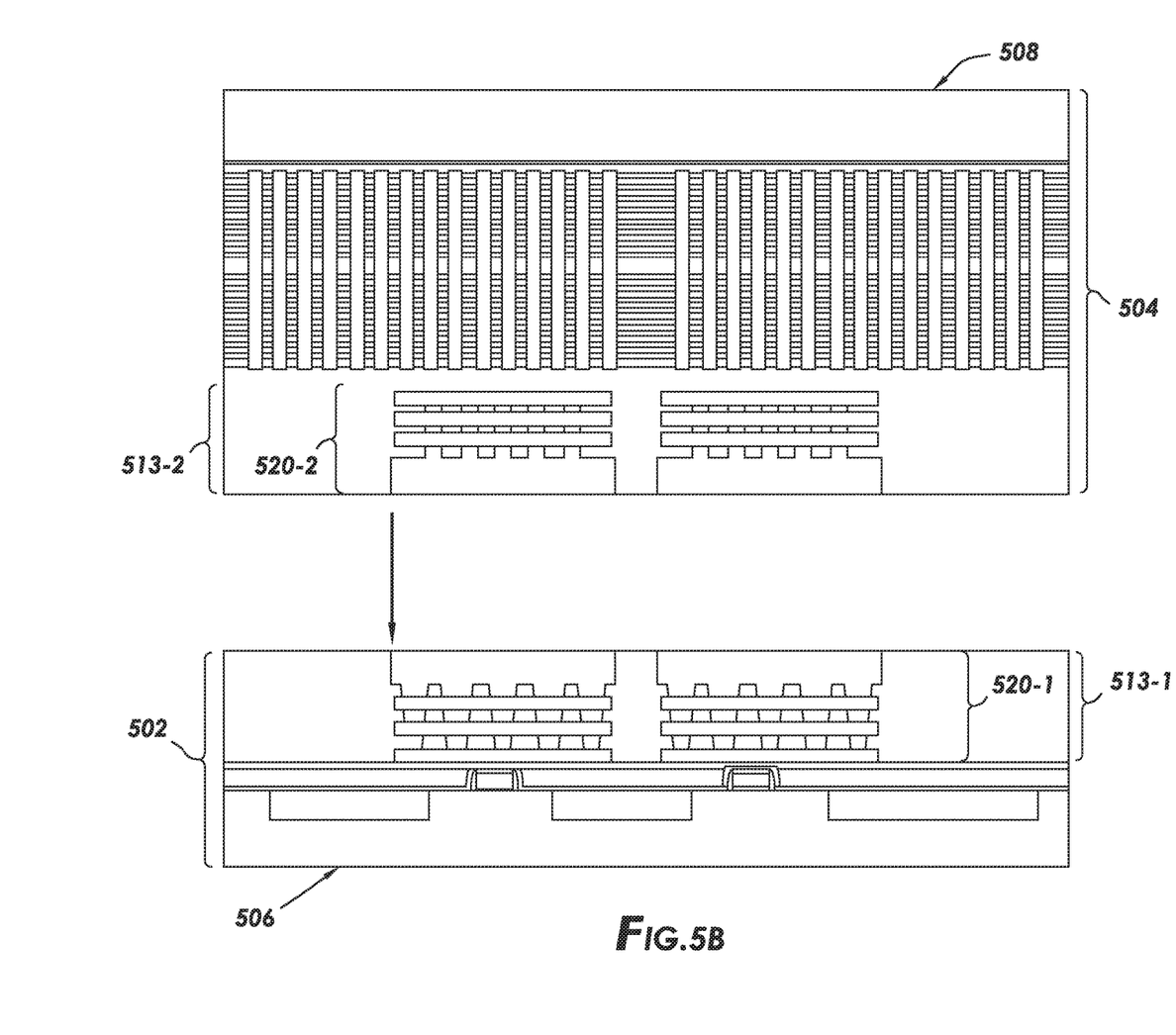
FIG. 5B illustrates a conceptual and method diagram in which a memory chip is fabricated, in accordance with some embodiments.

FIG. 5B demonstrates a manner in which the memory structure 502 and 504 are positioned such that the metal layers 513-1 and 513-2 are facing each other. In FIG. 5B, the second memory structure 504 is turned upside down and the second portion of the inductor 520-2 is aligned with the first portion of the inductor 520-1. In the next step, the two memory structures are bonded together using a wafer to wafer bonding process, which creates a permanent bond.

Figure 5C:
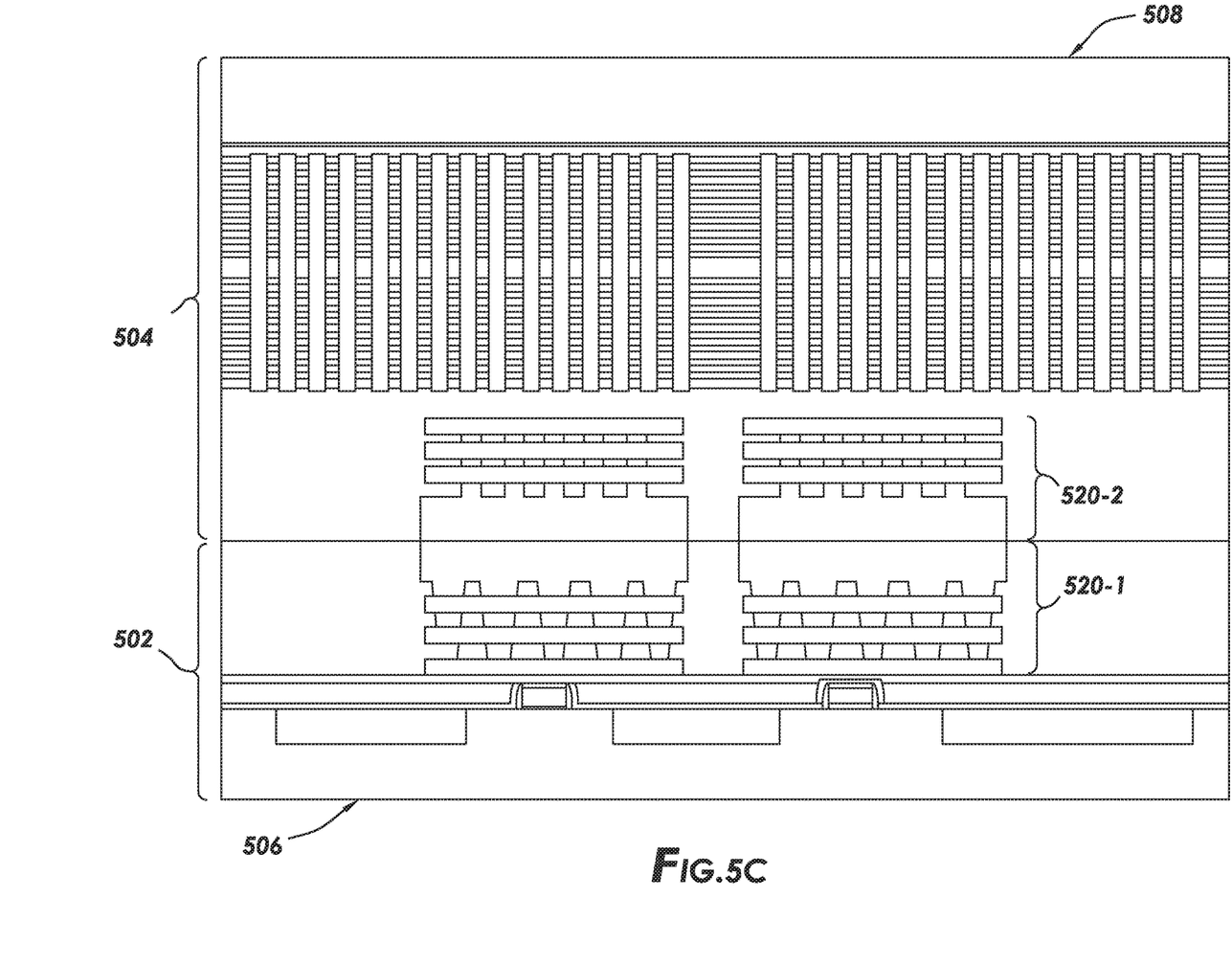
FIG. 5C illustrates a conceptual and method diagram in which a memory chip is fabricated, in accordance with some embodiments.

FIG. 5C demonstrates a manner in which the second memory structure 504 is placed on the first memory structure 502. As illustrated in FIG. 5C, the bonding areas of the inductors are aligned and as previously described, the two memory structures are bonded together by a permanent bond and form a memory as described in FIGS. 3A and 3B.

Figure 6:
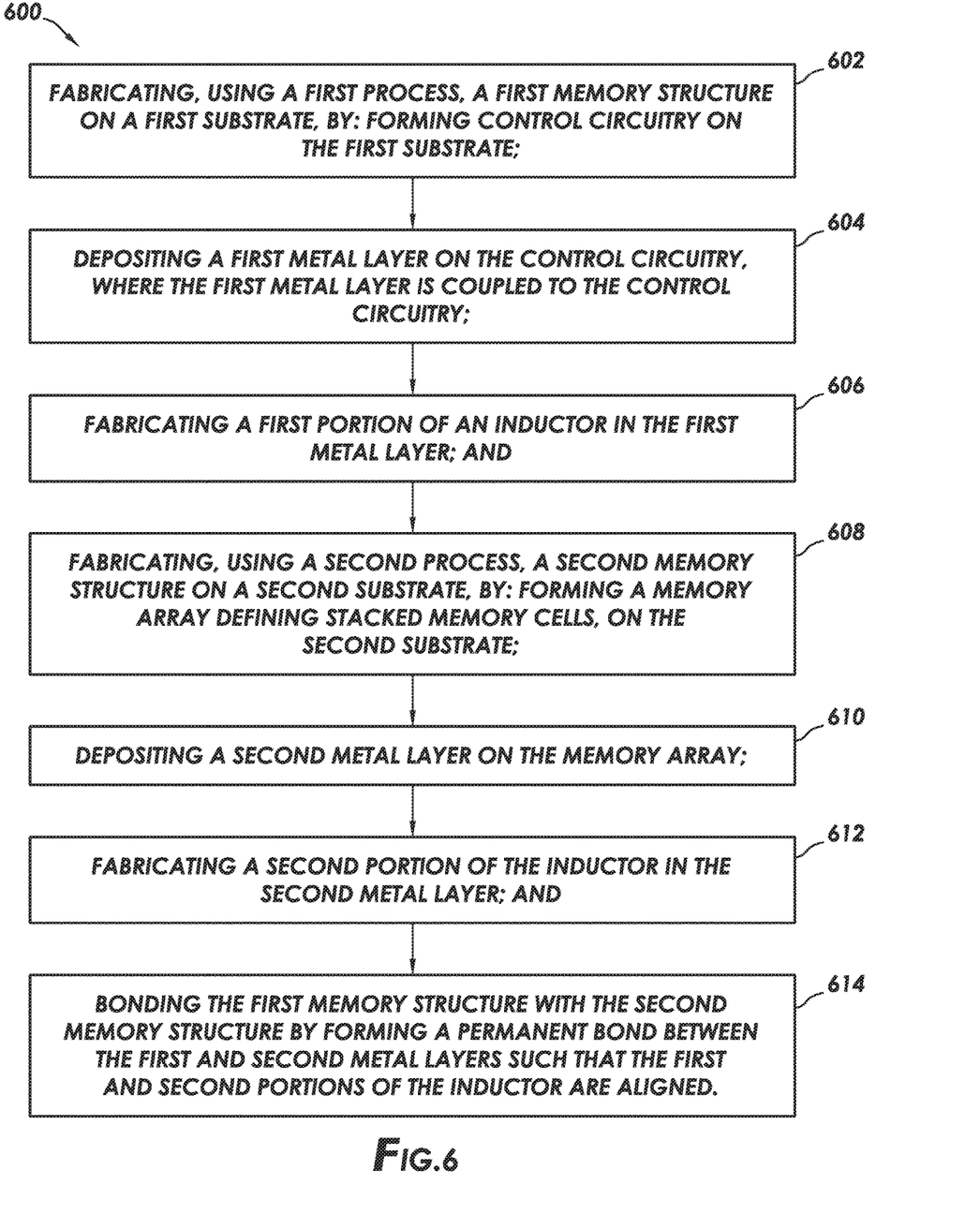
FIG. 6 illustrates a method diagram, in accordance with some embodiments.

FIG. 6 shows a method in accordance with at least some embodiments. In particular, the method is performed in a factory or fab setting and includes: fabricating, using a first process, a first memory structure on a first substrate, by: forming control circuitry on the first substrate (block 602); depositing a first metal layer on the control circuitry, where the first metal layer is coupled to the control circuitry (block 604); fabricating a first portion of an inductor in the first metal layer (block 606).

The method additionally includes fabricating, using a second process, a second memory structure on a second substrate, by: forming a memory array defining stacked memory cells, on the second substrate (block 608); depositing a second metal layer on the memory array (block 610); fabricating a second portion of the inductor in the second metal layer (block 612); and bonding the first memory structure with the second memory structure by forming a permanent bond between the first and second metal layers such that the first and second portions of the inductor are aligned (block 614).

The above discussion is meant to be illustrative of the principles and various embodiments described herein. Numerous variations and modifications will become apparent to those skilled in the art once the above disclosure is fully appreciated. For example, although a controller 104 has been described as performing the methods described above, any processor executing software within a host system can perform the methods described above without departing from the scope of this disclosure. In particular, the methods and techniques described herein as performed in the controller, may also be performed in a host. Furthermore, the methods and concepts disclosed herein may be applied to other types of persistent memories other than flash. It is intended that the following claims be interpreted to embrace all such variations and modifications.

What is claimed is:

1. A non-volatile memory including an in-chip boost converter comprising:
    a first memory structure defining control circuitry disposed on a first substrate, and a first metal layer disposed adjacent the control circuitry, wherein the first metal layer couples elements of the control circuitry; and
    a second memory structure defining a memory array disposed on a second substrate, and a second metal layer disposed adjacent the memory array, wherein the first and second metal layers are bonded together by a permanent physical bond formed between the first and second metal layers;
    a boost converter defining an inductor disposed in the first and second metal layers, and a transistor circuit disposed in the control circuitry.

2. The non-volatile memory of claim 1, wherein the inductor further defines a first terminal coupled to a voltage source, and a second terminal coupled to a load by way of a transistor circuit.

3. The non-volatile memory of claim 2, wherein the transistor circuit further defines:
    a boost node coupled to the second terminal of the inductor;
    a switch defining a gate terminal coupled to a clock, a first switch terminal coupled to the boost node, and a second switch terminal coupled to ground; and
    a transistor defining a gate terminal coupled to the boost node, a first transistor terminal coupled to the boost node, and a second transistor terminal coupled to the load.

4. The non-volatile memory of claim 1, wherein:
    the inductor defines a first terminal coupled to a voltage source, and a second terminal coupled to a load by way of a transistor circuit defined in the control circuitry, the inductor and transistor circuit form a boost converter; and
    the boost converter is configured to increase an amount of voltage of the voltage source.

5. The non-volatile memory of claim 1, wherein:
    the first memory structure defines a first portion of the inductor, wherein the first portion of the inductor defines a number of metal layers, and
    the second memory structure defines a second portion of the inductor, wherein the second portion of the inductor defines a second number of metal layers, wherein the second number of metal layers is less than or equal to the number of metal layers.

6. The non-volatile memory of claim 5, wherein the second portion of the inductor is aligned with dummy memory cells.

7. The non-volatile memory of claim 1, wherein the inductor comprises at least one selected from a group consisting of: aluminum, copper, cobalt, or some combination thereof.

8. A method for manufacturing a three dimensional memory structure including an in-chip boost converter comprising:
    fabricating, using a first process, a first memory structure on a first substrate, by:
        forming control circuitry on the first substrate;
        depositing a first metal layer on the control circuitry, wherein the first metal layer is coupled to the control circuitry; and
        fabricating a first portion of an inductor in the first metal layer;
    fabricating, using a second process, a second memory structure on a second substrate, by:
        forming a memory array defining stacked memory cells, on the second substrate;
        depositing a second metal layer on the memory array; and
        fabricating a second portion of the inductor in the second metal layer; and
    bonding the first memory structure with the second memory structure by forming a permanent bond between the first and second metal layers such that the first and second portions of the inductor are aligned.

9. The method of claim 8, wherein the inductor further defines a first terminal coupled to a voltage source, and a second terminal coupled to a load by way of a transistor circuit defined in the control circuitry.

10. The method of claim 9, wherein the transistor circuit further defines:

a boost node coupled to the second terminal of the inductor;

a switch defining a gate terminal coupled to a clock, a first switch terminal coupled to the boost node, and a second switch terminal coupled to ground; and a transistor defining a gate terminal coupled to the boost node, a first transistor terminal coupled to the boost node, and a second transistor terminal coupled to the load.

11. The method of claim 8, wherein:

the inductor further defines a first terminal coupled to a voltage source, and a second terminal coupled to a load by way of a transistor circuit defined in the control circuitry, the inductor and transistor circuit form a boost converter, and the boost converter is configured to increase an amount of voltage of the voltage source.

12. The method of claim 8, wherein bonding the first memory structure with the second memory structure creates an inductor having:

a line spacing between coils that is between 2 micrometers and 25 micrometers, a line width between 5 micrometers and 25 micrometers, and a line thickness between 1 micrometers and 10 micrometers.

13. The method of claim 12, wherein bonding the first memory structure with the second memory structure creates metal layers having a height between 2 micrometers to 12 micrometers.

14. The method of claim 8, wherein fabricating the first portion of the inductor in the first metal layer further comprises fabricating a number of metal layers within the first metal layer.

15. The method of claim 14, wherein:

fabricating the second portion of the inductor in the second metal layer further comprises fabricating additional metal layers in a first portion of the second metal layer, wherein a number of the additional metal layers is less than the number of metal layers, and further wherein a bit line is fabricated in a second portion of the second metal layer, the second portion of the second metal layer different from the first portion of the second metal layer.

16. The method of claim 8, further comprising, fabricating the first and second portions of the inductor from a metal comprising at least one selected from a group consisting of: aluminum, copper, cobalt, or some combination thereof.

17. A memory controller, comprising:

a first terminal configured to couple to a three dimensional memory including an in-chip boost converter defining an inductor disposed in metal layers between a memory array and control circuitry, the memory controller configured to:

pre-charge a circuit in the control circuitry by way of the in-chip boost converter; and perform a memory operation.

18. The memory controller of claim 17, wherein the three dimensional memory is formed by fabricating a first memory structure defining the control circuitry on a first wafer and fabricating a second memory structure defining the memory array on a second wafer.

19. The memory controller of claim 18, wherein the three dimensional memory is further formed by bonding the first and second wafers, wherein bonding the first and second wafers further creates the inductor disposed in the metal layers.

20. The memory controller of claim 17, wherein the memory controller is configured to perform a memory operation comprising at least one selected from a group consisting of: a read operation, a write operation, transferring data from a bus, and performing a logic operation.

* * * * *